(12) United States Patent
Hayashi et al.

(10) Patent No.: US 6,440,754 B2
(45) Date of Patent: Aug. 27, 2002

(54) THIN FILM FERROELECTRIC CAPACITORS HAVING IMPROVED MEMORY RETENTION THROUGH THE USE OF ESSENTIALLY SMOOTH BOTTOM ELECTRODE STRUCTURES

(75) Inventors: Shinichiro Hayashi, Colorado Springs, CO (US); Tatsuo Otsuki, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/843,230

(22) Filed: Apr. 26, 2001

Related U.S. Application Data

(62) Division of application No. 08/810,538, filed on Mar. 3, 1997, now Pat. No. 6,265,738.

(51) Int. Cl.[7] .............................................. H01L 21/00
(52) U.S. Cl. .............................. 438/3; 438/3; 438/239; 438/240; 438/280; 438/261; 438/396; 438/782; 438/758; 438/778; 438/785; 257/295; 257/296; 257/309
(58) Field of Search ............................ 438/3, 239, 240, 438/396, 280, 261, 782, 758, 778, 785; 257/295, 296, 309; 117/90; 310/358; 365/145; 427/55

(56) References Cited

U.S. PATENT DOCUMENTS

| 3,939,292 A | 2/1976 | Rohrer |
| 4,931,897 A | 6/1990 | Tsukamoto et al. |
| 5,005,102 A | 4/1991 | Larson |
| 5,423,285 A | 6/1995 | Paz de Araujo et al. |
| 5,495,438 A | 2/1996 | Omura |
| 5,519,234 A | 5/1996 | Paz de Araujo et al. |
| 5,539,279 A | 7/1996 | Tekeuchi et al. |
| 5,592,409 A | 1/1997 | Nishimura et al. |
| 5,592,410 A | 1/1997 | Verhaeghe et al. |
| 5,600,587 A | 2/1997 | Kolke |
| 5,612,560 A | 3/1997 | Chivukula et al. |
| 6,255,762 B1 * | 7/2001 | Sakamaki et al. .......... 310/358 |

FOREIGN PATENT DOCUMENTS

| EP | 0 448 151 A1 | 9/1991 |
| EP | 05251258 | 9/1993 |
| WO | WO 96/29728 | 9/1996 |

OTHER PUBLICATIONS

Eichorst et al., "Effects of platinum electrode structures on crystallinity and electrical properties of MOD–prepared PZT capacitors," Ferroelectric Thin Films III Symposium, Mater. Res. Soc. (San Francisco, CA), p. 201–208 (Apr. 13–16, 1993).

Smolenskii et al., "Ferroelectrics and Related Materials," Ferroelectricity and Related Phenomena, Gordon & Breach Science Publishers, vol. 3.

* cited by examiner

Primary Examiner—Matthew Smith
Assistant Examiner—B. V. Keshavan
(74) Attorney, Agent, or Firm—Patton Boggs LLP

(57) ABSTRACT

A ferroelectric thin film capacitor has smooth electrodes permitting comparatively stronger polarization, less fatigue, and less imprint, as the ferroelectric capacitor ages. The smooth electrode surfaces are produced by carefully controlled drying, soft baking, and annealing conditions.

7 Claims, 9 Drawing Sheets

THIN FILM FERROELECTRIC CAPACITORS HAVING IMPROVED MEMORY RETENTION THROUGH THE USE OF ESSENTIALLY SMOOTH BOTTOM ELECTRODE STRUCTURES

RELATED APPLICATIONS

This application is a divisional application of application Ser. No. 08/810,538 filed Mar. 3, 1997 now U.S. Pat. No. 6,265,738.

BACKGROUND OF THE INVENTION

1. Field of the Invention

The present invention pertains to method and apparatus involving thin film ferroelectrics for use in integrated circuits. More particularly, a smooth bottom electrode structure adjacent a ferroelectric thin film layered superlattice material improves the memory retention characteristics of a ferroelectric capacitor through less imprint and longer memory retention time.

2. Statement of the Problem

Thin film ferroelectric materials are used in a variety of nonvolatile random access memory devices. For example, U.S. Pat. No. 5,600,587 issued to Koike teaches a ferroelectric nonvolatile random access memory using memory cells consisting of a ferroelectric capacitor and a switching transistor. U.S. Pat. No. 5,495,438 issued to Omura teaches a ferroelectric memory that is formed of ferroelectric capacitors connected in parallel. The capacitors have ferroelectric materials of different coercive field values and, consequently, can use or store multi-value data. U.S. Pat. No. 5,592,409 issued to Nishimura et al teaches a nonvolatile memory including a ferroelectric layer that is polarized by the impressed voltage between two gates. The polarization or memory storage state is read as a high or low current flow across the ferroelectric layer, which permits nondestructive readout. U.S. Pat. No. 5,539,279 issued to Takeuchi et al teaches a high speed one transistor-one capacitor ferroelectric memory that switches between two modes of operation including a dynamic random access memory ("DRAM") mode and a ferroelectric random access memory ("FERAM") mode.

FIG. 1 depicts an ideal polarization hysteresis curve 100 for ferroelectric thin films. Side 102 of curve 100 is produced by measuring the charge on a ferroelectric capacitor while changing the applied field E from a positive value to a negative value. Side 104 of curve 100 is produced by measuring the charge on the ferroelectric capacitor while changing the applied field E from a negative value to a positive value. The points $-E_c$ and $E_c$ are conventionally referred to as the coercive field that is required to bring polarization P to zero. Similarly, the remanent polarization Pr or −Pr is the polarization in the ferroelectric material at a zero field value. The Pr and −Pr values ideally have the same magnitude, but the values are most often different in practice. Thus, polarization measured as 2Pr is calculated by adding the absolute values of the actual Pr and −Pr values even though these values may differ in magnitude. The spontaneous polarization values Ps and −Ps are measured by extrapolating a linear distal end of the hysteresis loop, e.g., end 106, to intersect the polarization axis. In an ideal ferroelectric, Ps equals Pr, but these values differ in actual ferroelectrics due to linear dielectric and nonlinear ferroelectric behavior. A large, boxy, substantially rectangular central region 108 shows suitability for use as a memory by its wide separation between curves 102 and 104 with respect to both coercive field and polarization.

Presently available ferroelectric materials depart from the ideal hysteresis shown in FIG. 1. Researchers have investigated materials for use in integrated ferroelectric devices since the 1970's, but these investigations have not yet been commercially successful due to the development of materials that depart from the ideal hysteresis. For example, U.S. Pat. No. 3,939,292 issued to Rohrer reports that early studies of ferroelectric materials for use in ferroelectric memories were performed on phase III potassium nitrate. In practice, it turned out that potassium nitrate materials had such low polarizabilities and were so badly afflicted by fatigue and imprint that the materials were practically useless in microelectronic memories. It is nearly impossible to find ferroelectrics that meet commercial requirements. The best materials for integrated ferroelectric devices are switched using a coercive field that can be obtained from conventional integrated circuit operating voltages, i.e., three to five volts ("V"). The materials should have a very high polarization, e.g., one exceeding twelve to fifteen microCoulombs per square centimeter ("$\mu C/cm^2$") determined as 2Pr, to permit the construction of memories having sufficient densities. Polarization fatigue should be very low or nonexistent. Furthermore, the ferroelectric material should not imprint, i.e., the hysteresis curve should not shift to favor a positive or negative coercive field.

FIG. 2 depicts the effects of environmental stress on hysteresis curve 100. Curve 200 shows the effect of fatigue on curve 100. Fatigue reduces the separation between curves 102 and 104 defining central region 108. Central region 108 progressively becomes smaller and smaller with additional fatigue. This change in separation is due to the creation of point charge defects arising in the ferroelectric material as a consequence of polarization switching together with the associated screening effect of the charge defects on the applied field. Thus, fatigue causes the ferroelectric material to wear out over time due to repeated polarization switching.

U.S. Pat. No. 5,519,234 issued to Araujo et al teaches that the fatigue problem of curve 200 is substantially overcome by the use of layered superlattice materials, such as the "layered perovskite-like" materials described in Smolenskii et al "Ferroelectrics and Related Materials," Gordon and Breach (1984). The layered superlattice materials are capable of providing a thin film ferroelectric material wherein the polarization state may be switched up to at least $10^9$ times with less than thirty percent fatigue. This level of fatigue endurance provides a significant advance in the art because it is at least about three orders of magnitude better than the fatigue endurance of other ferroelectrics, e.g., lead zirconium titanate ("PZT") or lead lanthanum zirconium ttanate ("PLZT"). Prior layered superlattice material work has been done primarily with the use of a Pt/Ti bottom electrode and layered superlattice material films on the order of 1800 Å thick. The titanium is used as an adhesion layer to prevent peeling of the electrode from the substrate.

According to section 15.3 of the Smolenskii book the layered perovskite-like materials or layered superlattice materials can be classified under three general types:

(A) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size, and $M=Ti^{4+}$, $Nb^{5+}$, $Ta^{5+}$, $Mo^{6+}$, $W^{6+}$, $Fe^{3+}$ and other ions that occupy oxygen octahedra;

(B) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (C) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$.

Smolenskii pointed out that the perovskite-like layers may have different thicknesses, depending on the value of m, and that the perovskite $AMO_3$ is in principal the limiting example of any type of layered perovskite-like structure with m=infinity. Smolenskii also noted that if the layer with minimum thickness (m=1) is denoted by P and the bismuth-oxygen layer is denoted by B, then the type I compounds may be described as . . . $BP_mBP_m$ . . . Further Smolenskii noted that if m is a fractional number then the lattice contains perovskite-like layers of various thicknesses, and that all the known type I compounds are ferroelectrics.

Despite the tremendous improvements in low fatigue ferroelectrics attributable to layered superlattice materials, there remains an imprint problem that is typified by curve 202 of FIG. 2. Curve 202 shows that environmental stresses can imprint curve 100 by shifting it to the right or left. This imprinting occurs when the ferroelectric material is subjected to repetitive unidirectional voltage pulses. Some imprinting also occurs as a result of normal hysteresis switching. The ferroelectric material retains a residual polarization or bias that shifts sides 102 and 104 in a positive or negative direction with respect to the applied field. Thus, curve 202 has been shifted in a positive direction 204 by repeated negative pulsing of a ferroelectric capacitor. A shift in the opposite direction could also occur due repetitive pulsing by opposite voltage. This type of pulsing represents what happens to the ferroelectric materials as a consequence of repeated unidirectional voltage cycling, such as the sense operations in FERAMs. Imprint can be so severe that the ferroelectric material can no longer retain a polarization state corresponding to a logical 1 or 0 value.

U.S. Pat. No. 5,592,410 issued to Verhaeghe refers to the ferroelectric imprint phenomenon as 'compensation.' The '410 patent teaches that the imprint problem can be reversed by pulsing voltage during the write cycle to return the hysteresis loop towards the unimprinted position of curve 100, as compared to curve 202. Thus, the imprint problem is reversed by special write operations in which the pulsed voltage is opposite the switching voltage. Still, the recommended voltage pulsing does not address the entire problem because the imprint phenomenon is a partially irreversible one. The observed imprinting reflects corresponding changes in microstructure of the ferroelectric crystal, e.g., the creation of point charge defects with associated trapping of polarized crystal domains. These changes in microstructure are not all reversible.

FIG. 3 depicts the deleterious effects of fatigue and imprinting on ferroelectric memory read/write control operations. Memory control logic circuits require a minimum polarization separation window, which is represented by shaded region 300. Region 300 must be large enough to produce a sufficient read-out charge for memory operations, e.g., for the operation of memory sense amplifier circuits. An initial 2Pr separation window 302 declines over the lifetime of the ferroelectric memory device along tracks 304 and 306 until, after about ten years or so of constant normal use, the separation between tracks 304 and 306 is too small for conducting memory operations. This lifetime of normal use follows stress time line 308. Curve 310 is a polarization hysteresis curve from the same material that produced curve 100, but is measured on decline at a point in time along tracks 304 and 306. The remanent polarization values Rms and Rmn correspond to +Pr and −Pr for the fatigued and imprinted material. Rms and Rmn are defined as remanent polarization at zero field in the fatigued hysteresis curve 310. Arrow 312 shows a quantity of positive polarization retention loss, which is primarily due to fatigue. Arrow 314 shows a quantity of negative polarization imprint loss, which is primarily caused by imprint shifting of curve 312 relative to curve 100. Arrow 316 shows a quantity of voltage center shifting of curve 312 relative to curve 100. This voltage center shifting indicates imprinting of the ferroelectric material.

There remains a need for ferroelectric thin film capacitors that resist fatigue well, have long memory retention times, and are substantially free of the imprint problem.

SOLUTION

It has been discovered that the imprint phenomenon represented as curve 202 in FIG. 2 is affected by surface irregularities on the ferroelectric film, e.g., those corresponding to hillocks on the bottom electrode in a thin film ferroelectric capacitor device or similar surface irregularities on the top of the ferroelectric film. In particular, the prior art Pt/Ti bottom electrodes form sharp hillocks that are especially prone to increase the amount of imprinting. Thus, ferroelectric capacitors having electrodes with sharp irregularities offer inferior electronic performance in integrated memories.

The present invention overcomes the problems outlined above by providing an essentially smooth or hillock-free bottom electrode for use in combination with layered superlattice materials. The ferroelectric materials are specially processed in deposition to present a similarly smooth surface for receipt of a top electrode. The layered superlattice materials resist fatigue well and their conformity to the smooth bottom electrode improves their imprint performance in integrated ferroelectric memories, such as FERAMs.

The smooth electrodes also permit the use of increasingly thinner films of layered superlattice materials without shorting of the ferroelectric capacitors. The thin films show a surprising improvement in their memory retention windows because memory retention windows in the thinner materials can have a greater magnitude than exists in comparable thicker materials. One would expect just the opposite effect because a greater number of oriented ferroelectric domains in the thicker materials should provide a greater cumulative polarization effect, but this greater cumulative polarization effect is not observed in practice. Thus, the use of smooth electrodes and thin films permits the construction of much better ferroelectric memories.

A thin film ferroelectric capacitor according to the present invention includes a bottom electrode having a first smooth surface, a ferroelectric thin film layered superlattice material, and a top electrode having a second smooth surface. The most preferred layered superlattice materials are strontium bismuth tantalate and strontium bismuth niobium tantalate. The ferroelectric thin film layered superlattice material contacts the smooth surfaces of the electrodes and has a thickness ranging from 500 Å to 2300 Å. A smooth surface on one of the electrodes is hereby defined as one in which all surface irregularity features protruding towards the thin film ferroelectric layered superlattice material protrude a distance less than twenty percent of the thickness in the ferroelectric thin film layered superlattice material thickness. It is also preferred that substantially all of the surface irregularities on the smooth electrode are rounded and essentially free of acute angles. Another way of defining a smooth surface is that the surface is smoother, i.e., having surface irregularities that are less sharp, less tall, and less numerous, than the surface irregularities of a comparable 2000 Å/200 Å thick Pt/Ti stacked electrode deposited on silicon which has been annealed while exposed to oxygen at 500° C. to 800° C. for one hour.

Ferroelectric thin film layered superlattice materials for use in the invention typically have thicknesses ranging from 500 Å to 2300 Å. Thicknesses above this range are also useful, though they are seldom needed. A more preferred range of layered superlattice material thickness is from 500 Å to 1100 Å. This range is even more preferably from 500 Å to 1000 Å, and is most preferably from 500 Å to 800 Å. The prior art does not show layered superlattice materials having these small thicknesses which are less than about 1300 Å.

Ferroelectric capacitors of the invention demonstrate superior electronic performance. For example, the ferroelectric thin film layered superlattice material is capable of providing a 3 V polarization or charge separation window of at least 7 $\mu C/cm^2$ after being fatigued by $10^{10}$ cycles of 6 V square wave switching at 125° C. These 6V switching pulses are very high, as compared to normal integrated circuit operating voltages and, consequently, tend to accelerate fatigue. The 7 $\mu C/cm^2$ separation window is sufficient for proper interaction with conventional integrated memory control logic circuits. The separation window increases as film thickness decreases down to about 500 Å. Layered superlattice material films thinner than about 500 Å crystallize differently and show porosity along grain or domain boundaries, which makes them unsuitable for use in ferroelectric capacitors.

Another aspect of superior electronic performance in the ferroelectric thin film layered superlattice materials according to the invention is superior resistance to imprinting. The ferroelectric thin film layered superlattice materials are also capable of demonstrating a hysteresis shift of less than 0.11 V corresponding to the 3 V polarization separation window after $10^{10}$ cycles of 6 V square wave switching, as described above.

Yet another aspect of superior electronic performance is the development of ultra thin ferroelectric layered superlattice material films that are essentially fatigue free. The use of smooth electrodes permits the use of ferroelectric thin films having less than about 2% of 2Pr degradation after being switched $10^{10}$ cycles using a 1.5 V triangular wave at 10,000 Hz. This exceptional ferroelectric performance comes from ultra thin films, e.g., those ranging from 500 Å to 800 Å in thickness.

In a preferred embodiment, the bottom electrode includes a platinum layer deposited on a titanium dioxide layer.

In another preferred embodiment, the bottom electrode includes a platinum layer deposited on a metal nitride, e.g., TiN, diffusion barrier layer on a titanium adhesion layer.

In less preferred embodiments, the bottom electrode includes a platinum layer on a titanium adhesion layer. These embodiments are less preferred because additional processing is required to provide a bottom electrode that is essentially free of sharp hillocks. Copending application Ser. No. 08/427,897 filed Apr. 26, 1995, and Ser. No. 08/473,432 filed Jun. 7, 1995, show methods of making Pt/Ti stacked electrodes having essentially smooth surfaces, and are hereby incorporated by reference to the same extent as though fully disclosed herein. The '897 and '432 applications are commonly owned with the present application. The '897 application teaches an electrode having an intermetallic barrier region formed of titanium adhesion metal and platinum. The metals are annealed at 600° C. to 800° C. for 30 minutes to 2 hours under a temporary capping layer of metal oxide, which is subsequently removed by an HF enchant and replaced by a second platinum layer. The '432 application teaches the use of a layered superlattice material thermal stress buffer layer interposed between the Pt/Ti stacked bottom electrode and the underlying substrate, e.g., a silicon wafer. The top electrode is preferably platinum.

The process of making the ferroelectric capacitors includes careful control of thermal process conditions. A smooth bottom electrode is formed wherein substantially all surface irregularity features on a bottom electrode are rounded and essentially free of acute angles. This smoothness derives from a proper selection of materials and anneal temperatures. For example, the need for smoothness requires a platinum on titanium dioxide electrode to be annealed under oxygen at a temperature of not more than almost exactly 450° C.

A liquid precursor is deposited on the bottom electrode to provide a precursor film. The precursor film is capable of yielding a ferroelectric layered superlattice material upon drying and annealing of the precursor film. Drying of the precursor film is done at a temperature less than 400° C. to provide a dried precursor residue. The dried precursor residue is soft baked using rapid thermal processing ("RTP") at an RTP temperature ranging from 525° C. to 725° C. for a period of time ranging from thirty seconds to five minutes. The RTP temperature more preferably ranges from 625° C. to 650° C., and is most preferably 650° C., which is the highest temperature that consistently produces a smooth upper surface on the resultant soft baked precursor residue. The soft baked precursor residue is annealed in a diffusion furnace under oxygen at an anneal temperature ranging from 500° C. to 650° C. The anneal temperature more preferably ranges from 520° C. to 560° C., and is most preferably 550° C., which is just barely sufficient to crystallize the ferroelectric layered superlattice material from the soft baked precursor residue.

Other features, objects, and advantages will become apparent to those skilled in the art upon reading the detailed description below in combination with the accompanying drawings.

DETAILED DESCRIPTION OF THE PREFERRED EMBODIMENT

Figure 4:
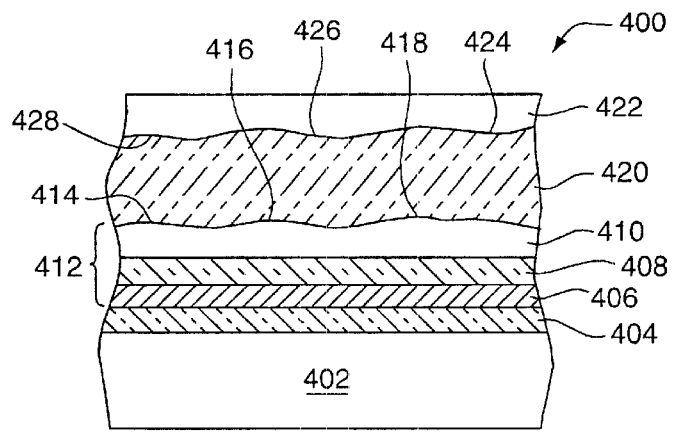
FIG. 4 depicts a ferroelectric capacitor having essentially smooth electrodes according to the present invention.

FIG. 4 depicts a preferred ferroelectric capacitor 400 according to the invention. A conventional wafer 402 supports ferroelectric capacitor 400, and is preferably a silicon wafer, but may also be any other conventional material including at least indium antimonide, magnesium oxide, strontium titanate, sapphire, quartz ruby, gallium arsenide, and combinations of these materials. A first isolation layer 404 of silicon dioxide, e.g., at least about 2000 Å thick, is preferably formed atop a silicon wafer 402. An adhesion layer 406 is made of titanium dioxide, which is also preferably about 1000 Å thick, followed by a 3000 Å thick platinum layer 410. A diffusion barrier layer 408 of about 1500 Å thick titanium nitride is optionally formed, atop the adhesion layer 406. Where the diffusion barrier layer 408 is used, adhesion layer 406 may comprise a 200 Å thickness of sputtered titanium, and platinum layer 410 may be 1500 Å thick.

Layers 406, 408, and 410 comprise bottom electrode 412, which presents a first smooth upper surface 414 having a plurality of surface irregularities, e.g., irregularities 416 and 418. A surface irregularity is hereby defined as a structural feature on the surface of an electrode that breaks what would, otherwise, be a smooth and uninterrupted flow of the electrode according to an intended contour. Examples of surface features include sharp or acute hillocks, small rounded mounds, and small rounded pits, in what is intended to be an essentially planar electrode surface. The thin film surface features or irregularities are visible at high magnification under scanning electron microscopic observation. The surface irregularities 416 and 418 are all rounded and essentially free of acute angles of the type that may be observed in hillocks on conventional Pt/Ti electrodes.

Alternative smooth electrode structures may be substituted for the bottom electrode 412 that is shown in FIG. 4. These alternative smooth electrode structures include Pt/Ti and Pt/SiO$_2$ stacked electrodes. Pt/Ti electrodes are generally undesirable because they are too rough unless they are made by the special processes described in copending applications Ser. Nos. 08/427,897 and 08/473,432. Any smooth electrode may be used as bottom electrode 412, and it will be understood that additional layers or fewer layers may be added to the example structure shown in FIG. 4, as required for whatever reason so long as the bottom electrode remains essentially smooth. Smoothness is especially needed for preventing spikes on the bottom electrode 412 from causing shorts through ferroelectric capacitor 400. Electrode smoothness also prevents surface irregularities from causing point charge or line defects in the thin film ferroelectric layered superlattice material layer 420.

A thin film ferroelectric layered superlattice material layer 420 contacts first smooth surface 414. Substantially none of the surface irregularities 416 and 418 on first smooth surface 414 protrude vertically towards ferroelectric layer 420 a distance greater than twenty percent of the vertical thickness in layer 414. It is even more preferable that these surface irregularities protrude less than fourteen percent.

A 2000 Å thick platinum top electrode 422 presents a second smooth surface 424 having a plurality of associated surface irregularities, e.g., irregularity 426. The surface irregularities 426 are all rounded and essentially free of acute angles of the type that may be observed in the hillocks of a conventional Pt/Ti stacked electrode. Substantially none of the surface features 416 and 418 on first smooth surface 414 protrude vertically towards ferroelectric layer 420 a distance greater than twenty percent of the vertical thickness in layer 414. Ferroelectric layer 420 conforms to first surface 414 and second surface 426 at the corresponding contact interfaces between ferroelectric layer 420, platinum layer 410 and top electrode 422.

There are two main reasons why the surface irregularities 416, 418, and 426 do not protrude into ferroelectric layer 420 a distance greater than twenty percent of the thickness in ferroelectric layer 420. The first reason involves breakdown voltage. The layered superlattice materials that have been studied thus far have breakdown voltages of about one MV/cm, i.e., from 0.9 MV to 1.1 MV. Thus, about 100 Å of layered superlattice material are needed to withstand 1 V without breakdown. It follows that two irregularities could be superposed over one another, between the electrodes, e.g., as surface irregularity 426 in substantial alignment with surface irregularity 416. Complete polarization of ferroelectric layer 420 cannot happen if breakdown occurs. Thus, at least 150 Å of layered superlattice material are needed to withstand a 1.5 V potential between electrodes 412 and 422. A 500 Å thick ferroelectric layer 420 that is designed to operate at 3 V requires a 300 Å thickness. Thus, a hillock can protrude only 200 Å into ferroelectric layer 420. The 200 Å equals forty percent (200/500=40%) of the 500 Å thickness in layer 420. About half of this value, i.e., twenty percent, is required for each electrode because the surface irregularities may be in vertical alignment across the respective electrodes.

The second reason involves a need to avoid imprinting ferroelectric layer 420. It has been determined from qualitative scanning electron microscopic data that surface irregularities of larger height have a greater effect in imprinting ferroelectric layers, such as ferroelectric layer 420, which contact electrodes having these large surface irregularities. Thus, the requirement that surface irregularities on each electrode protrude less than twenty percent into ferroelectric layer 420 is more preferably less than fourteen percent and even more preferably less than seven percent, though it is difficult to make seven percent electrodes for use with 500 Å and 600 Å thick ferroelectric layers 420.

Ferroelectric capacitor device 400 forms part of an integrated memory circuit in the intended environment of use. Those skilled in the art understand that ferroelectric capacitor devices have additional uses including use as ferroelectric transistor gates and logic circuits.

Figure 5:
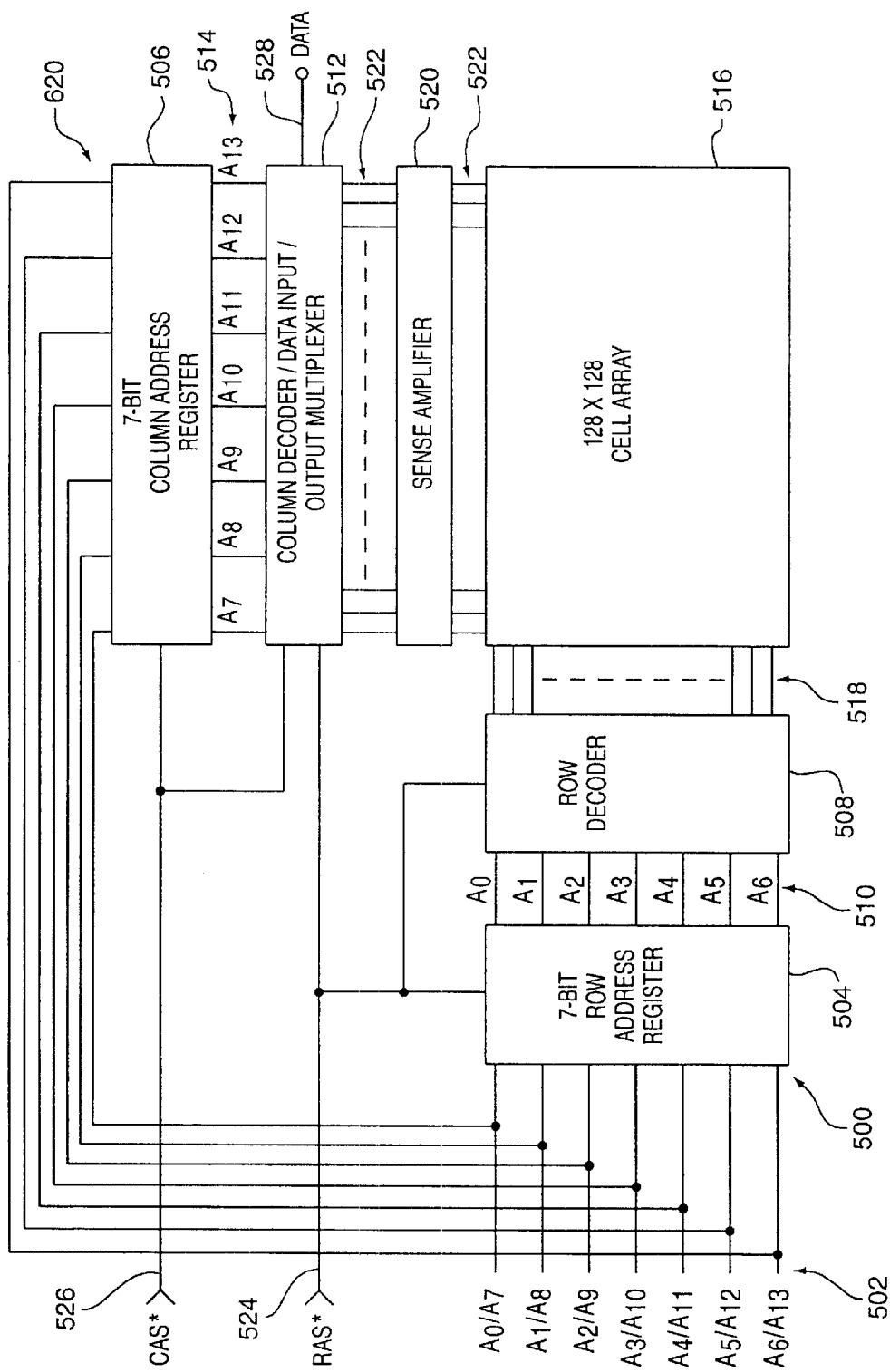
FIG. 5 depicts a circuit diagram of an integrated circuit memory which is a preferred use of the FIG. 4 ferroelectric capacitor.

FIG. 5 is a block diagram illustrating an exemplary integrated circuit memory 500 in which ferroelectric switching capacitors or high dielectric constant capacitors made with the materials of the invention are utilized. For simplicity, the embodiment shown is for a 16 kilo bit ("16 K") DRAM; however the material may be utilized in a wide variety of sizes and types of memories, both volatile and non-volatile. In the 16K embodiment shown, there are seven address input lines 502 which connect to a row address register 504 and a column address register 506. The row address register 504 is connected to row decoder 508 via seven lines 510, and the column address register 506 is connected to a column decoder/data input output multiplexer 512 via seven lines 514. The row decoder 508 is connected to a 128×128 memory cell array 516 via 128 lines 518, and the column decoder/data input output multiplexer 512 is connected to the sense amplifiers 520 and memory cell array 516 via 128 lines 522. A RAS* signal line 524 is connected to the row address register 504, row decoder 508, and column decoder/data input/output multiplexer 512, while a CAS* signal line 526 is connected to the column address register 506 and column decoder/data input output multiplexer 512. (In the discussion herein, a* indicates the inverse of a signal.) An input/output data line 528 is connected to the column decoder/data input output multiplexer 512. Memory cell array 516 contains 128×128=16,384 memory cells, which is conventionally designated as 16K These cells are ferroelectric switching capacitor-based cells according to the present invention.

Figure 6:
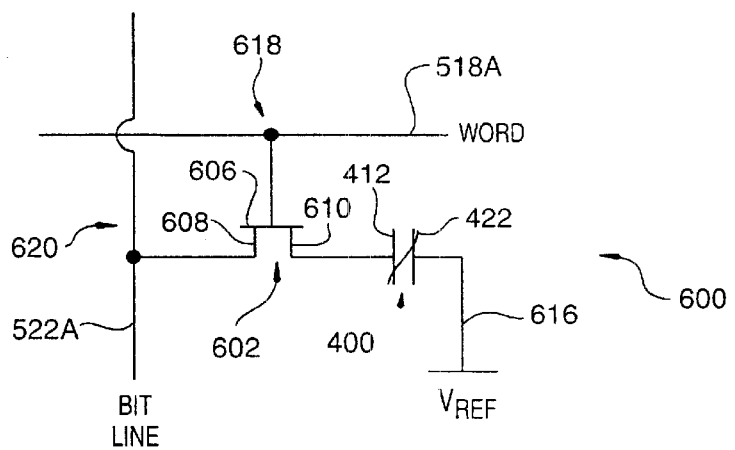
FIG. 6 depicts a circuit diagram of an individual integrated circuit non-volatile memory cell such as may be used in the memory of FIG. 5 and utilizing the FIG. 4 ferroelectric capacitor.

FIG. 6 depicts a ferroelectric capacitor-based switching cell 600. Cell 600 includes two electrically interconnected electrical devices, namely, a transistor 602 and a ferroelectric switching capacitor 400. The gate 606 of transistor 602 is connected to line 518A, which is one of the lines 518 (see FIG. 5) which are generally called "word lines". Source/drain 608 of transistor 602 is connected to line 522A, which is one of lines 522 that are generally called "bit lines". The other source/drain 610 of transistor 602 is connected to bottom electrode 412 of switching capacitor 400. The top electrode 422 of switching capacitor 400 is connected to line 616 which is connected to a reference voltage $V_{ref}$.

Figure 7:
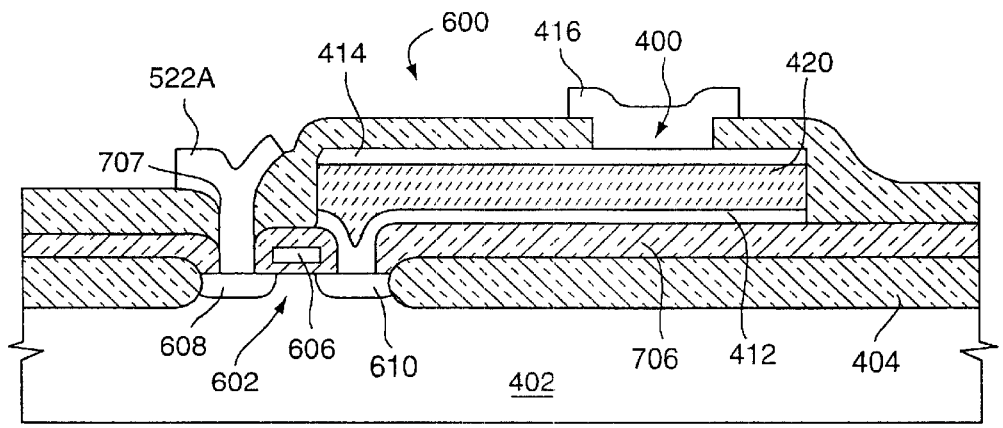
FIG. 7 depicts a layered construction showing how individual memory cells may be implemented in an integrated circuit memory corresponding to FIGS. 5 and 6.

Cell 600 may be fabricated as an integrated circuit FERAM, as shown in FIG. 7. The individual elements just described in connection with FIG. 6 are labeled with the same numbers in FIG. 6. As shown in FIG. 7, memory cell 600 includes a thin film ferroelectric layer 420. Wafer 402 is doped to provide source/drain regions 608 and 610. Layer 706 is an additional isolation layer that is preferably made of spin-on glass, or other phosphorous-doped or non-doped silicon dioxide. Bottom electrode 412 is constructed as described in the discussion of FIG. 4. Bit line 522A is preferably made of platinum, or aluminum.

The operation of the memory in FIGS. 5 through 7 is as follows. Row address signals $A_0$ through $A_6$ (see FIG. 5) and column address signals $A_7$ through $A_{13}$ placed on lines 502 are multiplexed by address registers 524 and 526 utilizing the RAS* and CAS* signals, and passed to the row decoder 508 and column decoder/data input/output multiplexer 512, respectively. The row decoder 508 places a high signal on the one of the wordlines 518 that is addressed. The column decoder/data input output multiplexer 518 either places the data signal which is input on line 528 on the one of the bit lines 522 corresponding to the column address, or outputs on the data line 528 the signal on the one of the bit lines 522 corresponding to the column address, depending on whether the function is a write or read function. As is known in the art, the read function is triggered when the RAS* signal precedes the CAS* signal, and the write function is triggered when the CAS* signal comes before the RAS* signal. The transistors 602 in the respective cells 600 connected to the word line that is high turn on, permitting the data signal on the bit line 522A to be read into the capacitor 400 or the signal on the capacitor 400 to be output on the bit line 522A, depending on whether the read or write function is implemented. As is well-known in the art, the sense amplifiers 520 are located along lines 522 to amplify the signals on the lines. Other logic required or useful to carry out the functions outlined above as well as other known memory functions is also included in the memory 500, but is not shown or discussed as it is not directly applicable to the invention.

As outlined above, the RAS* and CAS* lines 524 and 526; registers 504 and 506; the decoders 508 and 510; and the transistor 602 comprise an information write means 618 (see FIG. 6) for placing the memory cell 600 in a first memory state or a second memory state depending upon information input to the memory on data line 528. The first memory cell state corresponds to layer 420 of ferroelectric material being in a first polarization state, and the second memory cell state corresponds to the layer 420 being in a second polarization state. These components plus sense amplifiers 520 comprise an information read means 620 for sensing the state of memory cell 600 and providing an electrical signal corresponding to the state. The necessity of sensing the polarization state of thin film ferroelectric layer 420 causes information read means to subject thin film ferroelectric layer 420 to repeat unidirectional voltage pulses.

Thin film ferroelectric layer 420 is preferably formed using a liquid deposition process, such as the process described in U.S. Pat. No. 5,423,285, which is hereby incorporated by reference to the same extent as though fully disclosed herein.

Figure 8:
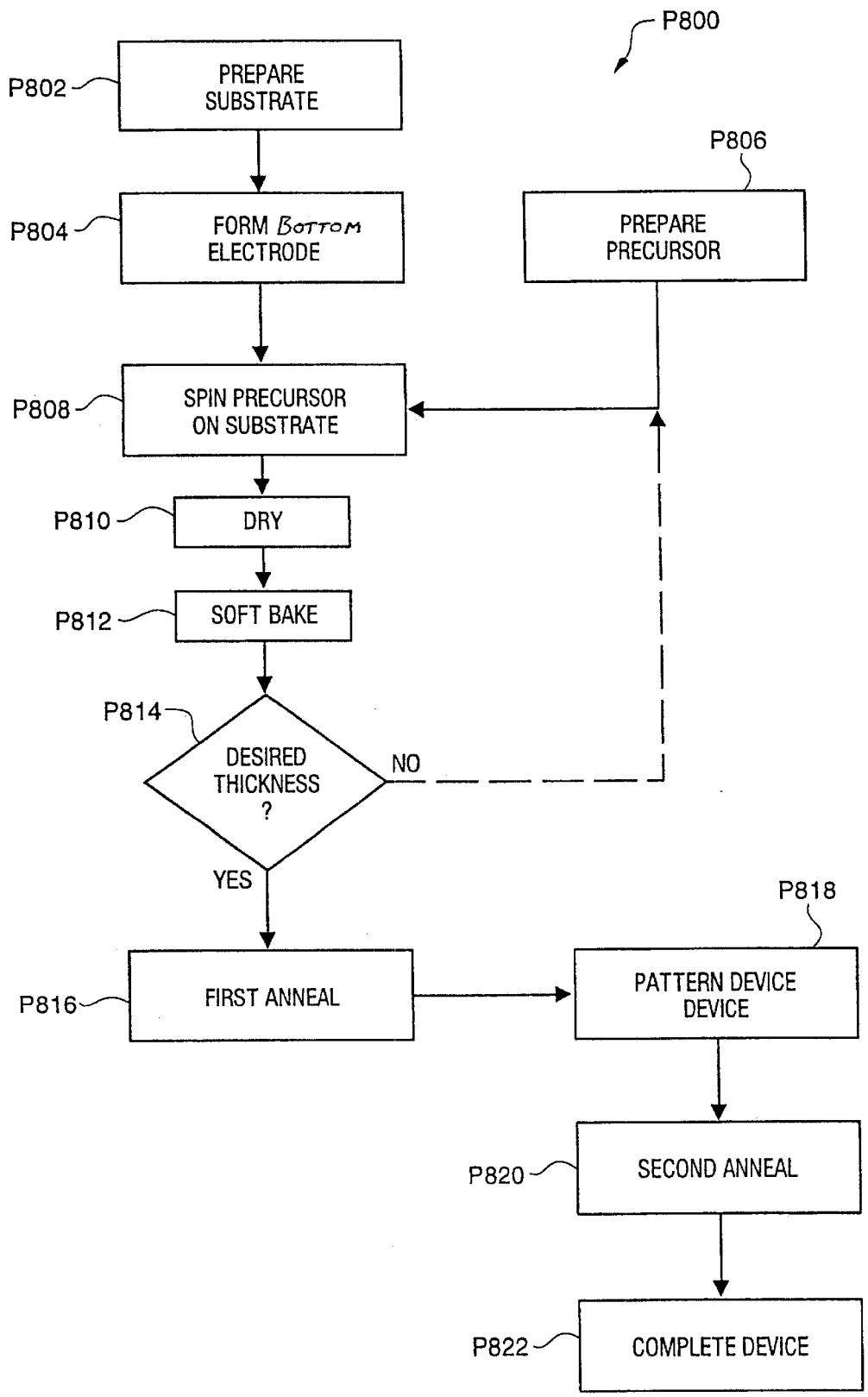
FIG. 8 depicts a schematic process diagram for use in making a memory cell corresponding to the FIG. 7 layered construction.

FIG. 8 depicts a schematic process diagram of process P800 for fabricating memory cell 600 of the present invention. In step P802, wafer 402 is made ready by conventional means to receive thin film ferroelectric layer 420. Accordingly, a silicon wafer 402 may be heated in an oxygen diffusion furnace to grow oxide layer 404. A contact hole 707 may be formed through oxide layer 404 by ion etching or other techniques to expose wafer 402, which is then n or p-doped by conventional means to provide source/drain regions 608 and 610. Transistor gate 606 is formed by conventional means. Isolation layer 706 may be deposited as spin-on glass or other phosphorous-doped or non-doped silicon dioxide by conventional chemical vapor deposition.

Bottom electrode 412 is formed in step P804. Titanium dioxide is formed by first sputtering titanium to a thickness ranging from 500 Å to 1500 Å followed by oxygen annealing in a diffusion furnace at 500° C. to 700° C. for a minimum of two hours including a twenty two minute ramp into the furnace and a twenty two minute ramp out of the furnace. Platinum is then sputtered to a thickness of 3000 Å. Alternatively, the platinum may be sputtered directly onto the wafer, but platinum electrodes sputtered in this manner sometime peel away in later process steps when the capacitor area is large. Yet another preferred alternative is to sputter respective titanium (200 Å), titanium nitride (500 –1500 Å), and simultaneously anneal the sputter-deposited layers in a diffusion furnace under a nitrogen atmosphere at 400° C. to 450° C. for a minimum of two hours including a twenty two minute ramp into the furnace and a twenty two minute ramp out of the furnace. Platinum (1000 to 2000 Å) is then sputtered and annealed in a substantially identical manner to complete the bottom electrode.

Step P806 includes the preparation of a liquid precursor. It is preferred to use a metal alkoxycarboxylate precursor that is prepared according to the reactions:

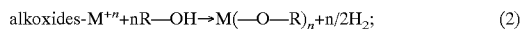 (2)

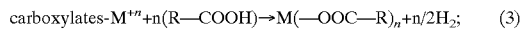 (3)

and

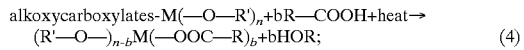 (4)

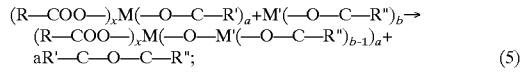 (5)

and

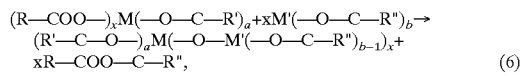 (6)

where M is a metal cation having a charge of n; b is a number of moles of carboxylic acid ranging from 0 to n; R' is preferably an alkyl group having from 4 to 15 carbon atoms; R is an alkyl group having from 3 to 9 carbon atoms; R" is an alkyl group preferably having from about zero to sixteen carbons; and a, b, and x are integers denoting relative quantities of corresponding substituents that satisfy the respective valence states of M and M'. M and M' are preferably selected from the group consisting of strontium, bismuth, niobium and tantalum. The exemplary discussion of the reaction process given above is generalized and, therefore, non-limiting. The specific reactions that occur depend on the metals, alcohols, and carboxylic acids used, as well as the amount of heat that is applied. A detailed example of step P806 is provided below as Example 1.

A reaction mixture including an alcohol, a carboxylic acid, and the metals, is refluxed at a temperature ranging from about 70° C. to 200° C. for one to two days, in order to facilitate the reactions. The reaction mixture is then distilled at a temperature above 100° C. to eliminate water and short chain esters from solution. The alcohol is preferably 2-methoxyethanol or 2-methoxypropanol. The carboxylic acid is preferably 2-ethylhexanoic acid. The reaction is preferably conducted in a xylenes or n-octane solvent. The reaction products are diluted to a molarity that will yield from 0.1 to 0.3 moles of the desired layered superlattice material per liter of solution. The most preferred solutions have a molarity ranging from 0.10 to 0.13.

The layered superlattice materials that derive from step P806 work best in their intended environment of use if the liquid precursor solutions are mixed to include an excess bismuth amount of at least five to ten percent. Some bismuth volatilization losses occur during the anneal steps P816 and P820. Other advantages of excess bismuth include the compensation of lattice defects. Thin film ferroelectric layered superlattice materials for use in ferroelectric layer 420 have been prepared to include stoichiometric excess bismuth amounts of 100 percent and more. These materials are ferroelectric, but can show reduced polarization unless the excess bismuth amounts are kept within the range from about 5% to 10% of the amount of bismuth that is required to satisfy the Smolenskii class A formula which is shown above. The solutions yield layered superlattice materials having metals in proportion to the metals in the precursor solution less volatilization losses from the anneal. Accordingly, the precursor solutions may be prepared with more or less than a stoichiometric mixture of A-site and B-site materials according to the Smolenskii formulae. For example, a solution may be prepared with excess bismuth and excess tantalum B-site metal. The solutions may also include mixtures of multiple A-site and multiple B-site metals, e.g., as in strontium bismuth niobium tantalate.

In step P808, the precursor solution from step P806 is applied to the substrate from step P804, which presents the uppermost surface 414 of bottom electrode 412 for receipt of thin film ferroelectric layer 420. Application of the liquid precursor is preferably conducted by dropping three to five ml of the liquid precursor solution at ambient temperature and pressure onto the uppermost surface of electrode 412 and then spinning wafer 402 to remove any excess solution and leave a thin-film liquid residue. For spin-on depositions, it is possible to vary the spin rate and the solution molarity to adjust the thickness of the liquid precursor solution film that resides on the bottom electrode 402. Alternatively, the liquid precursor may be applied by a misted deposition technique or chemical vapor deposition with metal organic source materials.

In steps P810, the precursor film from step P808 is dried to remove solvent and other volatile organics. The precursor is dried on a hot plate in a dry air atmosphere and at a temperature of from about 150° C. to 400° C. for a sufficient time duration to remove substantially all of the organic materials from the liquid thin film and leave a dried metal oxide residue. This period of time is preferably from about one minute to about thirty minutes. The most preferred drying conditions provide a two stage drying that is performed first at 150° C. for two minutes then at 260° C. for four minutes.

Step P812 includes soft baking the dried precursor residue from step P808 at a greater temperature than was used in step P808. The soft bake preferably includes placement of the wafer under a conventional RTP lamp at 525° C. to 675° C. for a time duration of from thirty seconds to five minutes. The most preferred RTP conditions are 650° C. for sixty seconds. These RTP conditions assure that the soft-baked precursor residue will have a smooth uppermost surface prior to deposition of top electrode 422. In contrast, photomicrographs of precursor residue that was soft-baked at 725° C. shows an unacceptably rough upper surface having a large proportion of hillock structures and large-scale surface irregularities greater than 400 Å in height. As an alternative to 650° C. RTP, the wafer may be soft baked in a diffusion furnace at 650° C. for ten minutes or so including four minute ramps into and out of the furnace, but this method sometimes produces an unsatisfactory or rough soft baked residue. The soft bake step P812 is essential in obtaining predictable or repeatable electronic properties in the crystalline compositions to be derived from process P800.

The following working example shows the parameters that were used to develop the ideal conditions for spin-on deposition. It was determined that 1300 rpm was the ideal rate for deposition of a 0.12 M precursor solution made of metal 2-ethylhexanoates and xylenes.

EXAMPLE 1

Materials Thicknesses Derived From Spin-On Process

A 0.2 M solution was prepared on commercial order from Hughes Technical Services of Vienna, Va., to yield to yield $SrBi_{2.61}(Nb_{0.66}Ta_{1.63})O_{10.64}$, and included strontium, bismuth, niobium, and tantalum 2-elthyhexanaotes in xylenes. An eyedropper was used to place a 2 ml aliquot of this solution onto a wafer spinning at 1300 rpm to provide a film of the precursor solution. The resultant film was dried first on a 150° C. hot plate for two minutes, then on a 260° C. hot plate for four minutes to leave a 2399 Å thick residue that shrank to a thickness of 1600 Å when soft-baked under RTP at 650° C. for sixty seconds. Thicknesses were measured using an ellipsometer. The solution was diluted with n-butyl acetate to 0.12 M and other spin-on velocities were tried. Table 1 below includes a summary of spin-on conditions for other films together with an indication of whether the films cracked when exposed to 650° C. RTP for sixty seconds.

TABLE 1

| Sample | RPM  | Solution Molarity | Thickness after drying Å | Thickness After RTP Å | Cracked? (Yes/No) |
|--------|------|-------------------|--------------------------|-----------------------|-------------------|
| A      | 1300 | 0.2               | 2399                     | 1600                  | Yes               |
| B      | 1000 | 0.2               | 2527                     | 1773                  | Yes               |
| C      | 800  | 0.2               | 2590                     | 1969                  | Yes               |
| D      | 700  | 0.2               | *2592                    | 2013                  | Yes               |
| E      | 1300 | 0.16              | 1633                     | Not measured          | No                |
| F      | 1300 | 0.14              | 1452                     | Not measured          | No                |
| G      | 1300 | 0.12              | 1314                     | Not measured          | No                |

In step P814, if the resultant soft baked precursor residue from step P812 is not of the desired thickness, then steps P808, P810 and P812 are repeated until the desired thickness is obtained. A thickness of about 1500 Å to 1800 521 typically requires two coats of a 0.12 M solution under the parameters disclosed herein.

In step P816, the dried precursor residue is annealed to form ferroelectric thin film layer 420 (see FIG. 4). This annealing step is referred to as the first anneal to distinguish it from a later annealing step. The first anneal is preferably performed in oxygen at a temperature of from 500° C. to 650° C. for a time from 30 minutes to 2 hours. Step P816 is more preferably performed at from 520° C. to 560 ° C. for 120 minutes, with the most preferred anneal temperature being about 550° C. This low temperature anneal is now made possible because X-ray diffraction analysis of thin film layered superlattice materials of the Smolenskii class A type crystallize from the dried residues of the preferred liquid metal 2-ethylhexanoate precursor solutions when the dried residues are annealed in oxygen at minimum temperatures ranging from 520° C. to 540° C. The low temperature anneal reduces the amount of roughness from thermally induced stresses within thin film ferroelectric layered superlattice material layer 420. The first anneal of step P816 most preferably occurs in an oxygen atmosphere using a 120 minute push/pull process including at least twenty two minutes for the "push" into the furnace and an identical time for the "pull" out of the furnace. All of these indicated anneal times include the time that is used to create thermal ramps into and out of the furnace.

In step P818, the second electrode 422 is deposited by sputtering. The device is then patterned by a conventional reactive ion etching process including the application of a photoresist followed by ion etching, as will be understood by those skilled in the art. This patterning preferably occurs before the second annealing step P820 so that the second anneal will serve to remove patterning stresses from memory cell 400 and correct any defects that are created by the patterning procedure.

The second annealing step, P820, is preferably performed at from 650° C. to 850° C. for 120 minutes, with the most preferred anneal temperature being about 800° C. The second anneal of step P820 most preferably occurs in an oxygen atmosphere using a 120 minute push/pull process including at least twenty two minutes for the "push" into the furnace and an identical time for the "pull" out of the furnace. The time for the second anneal is preferably the same as for the first anneal P816.

Finally, in step P822 the device is completed and evaluated. The completion may entail the deposition of additional layers, ion etching of contact holes, and other conventional procedures, as will be understood by those skilled in the art. Wafer 402 may be sawed into separate units to separate a plurality of integrated circuit devices that have been simultaneously produced thereon.

The following non-limiting examples set forth preferred materials and methods for practicing the invention hereof.

EXAMPLE 2

Preparation of Ferroelectric Capacitor Devices

A plurality of ferroelectric capacitor devices 400 were prepared on a single wafer 402 using a 0.2 M layered superlattice material precursor solution that was purchased on commercial order from Hughes Technical Services Corporation of Vienna, Va. Chemical analysis of the solution confirmed that it contained metal hexanoates in xylenes with the metals being in proportions corresponding to the metals in an empirical formula $SrBi_{2.61}(Nb_{0.66}Ta_{1.63})O_{10.27}$. Thus, the solution had a stoichiometric excess amount of bismuth and a stoichiometric excess amount of Nb and Ta B-site metals, as compared to a Class A Smolenskii formula (see above) wherein m=2. The discussion below makes reference to FIG. 8.

Process step P802 was commenced by placing a commercially available silicon wafer placing in a diffusion furnace to grow oxide layer 404 (see FIG. 4). Titanium dioxide was formed by first sputtering titanium to a thickness of about 1000 Å followed by oxidation in a diffusion furnace under an oxygen atmosphere at 650° C. for a two hours including a twenty two minute ramp into the furnace and a twenty two minute ramp out of the furnace. Platinum was then sputtered to a thickness of 3000 Å thick to complete step P804.

Step P808 was performed by placing the wafer in a conventional spin-coater machine and spinning the wafer at 1300 rpm while an eyedropper was used to place 4 ml of solution onto the spinning wafer.

In step P810, the wafer was placed on a 150° C. hot plate for two minutes in air then removed and immediately placed on a second hot plate at 260° C. for four minutes to dry the liquid precursor. In step P812, the dried liquid precursor residue was exposed in air to a conventional rapid thermal processing lamp at 650° C. for sixty seconds to soft bake the dried precursor residue.

As a consequence of step P814, the steps of applying the liquid precursor solution, drying, and soft baking were repeated a second time to build layer thickness of the soft baked material up to about 2000 Å.

A first anneal P816 of the soft baked precursor residue was conducted in a diffusion furnace under an oxygen flow at 550° C. for two hours including a twenty two minute ramp into the furnace and a twenty two minute ramp out of the furnace. A 2000 Å thick platinum top electrode was sputtered into place to begin step P818. The top electrode was covered with a conventional spin-on negative photoresist. The wafer including the resist was baked in air on a hot plate at 100° C. for five minutes, after which time the wafer was exposed to ultraviolet radiation under mask to pattern the resist. The resist was developed for 1.5 minutes in an n-butyl acetate rinse under nitrogen atmosphere. The developed pattern was hard baked on a hot plate at 140° C. for five minutes. The wafer was next subjected to ion mill etching. The resist was removed by conventional plasma stripping.

Step P820 included annealing the top electrode in an oxygen diffusion furnace at 800° C. for two hours including a twenty two minute ramp into the furnace and a twenty two minute ramp out of the furnace.

As a result of this process, the final wafer held a plurality of square ferroelectric capacitors 400 each having a 6940 $\mu m^2$ surface area.

EXAMPLE 3
Preparation of Ferroelectric Capacitor Devices

A plurality of ferroelectric capacitor devices 400 were prepared on a single wafer 402 using a 0.2M layered superlattice material precursor solution that was purchased on commercial order from Kojundo Chemical Corporation of Japan. Chemical analysis of the solution confirmed that it contained metal hexanoates in octanes wherein the metals were in proportions that were designed to yield $SrBi_{2.6}(Nb_{0.4}Ta_{1.8})O_{10.4}$ under oxygen anneal conditions. Thus, the solution had a stoichiometric excess amount of bismuth, as well as a stoichiometric excess amount of Nb and Ta B-site metals, as compared to a Class A Smolenskii formula (see above) wherein m=2. The discussion below makes reference to FIG. 8.

Process step P802 was commenced by placing a commercially available silicon wafer in a diffusion furnace to grow an oxide layer. Titanium dioxide was formed by first sputtering titanium to a thickness of 1000 Å followed by oxidation in a diffusion furnace under an oxygen atmosphere at 650° C. for a minimum of two hours including a twenty two minute ramp into the furnace and a twenty two minute ramp out of the furnace. Platinum was sputtered to a thickness of 3000 Å, which completed step P804. Step P808 was performed by placing the wafer in a liquid source misted chemical deposition machine (model no. Primaxo 2F), which was made by Submicron Systems Incorporation of Allentown, Pa., and depositing the wafer at approximately 595 Torr for 10 minutes while precursor solution was misted by an atomizer and then introduced into deposition chamber by carrier gas of nitrogen onto the wafer rotating at 5 rpm, though 10 minutes of deposition time was adjusted to form desirable thick films, especially it was reduced to build ultra thin films less than 1000 Å.

In step P810, the wafer was placed on a 150° C. hot plate for two minutes in air then removed and immediately placed on a second hot plate at 260° C. for four minutes to dry the liquid precursor. In step P812, the dried liquid precursor residue was exposed in air to a rapid thermal processing lamp at 650° C. for sixty seconds to soft bake the precursor residue. As a consequence of step P814, the steps of applying the liquid precursor solution, drying, and soft baking were repeated a second time to build layer thickness of the soft baked material up to about 2000 Å. A first anneal P816 of the soft baked precursor residue was conducted in a diffusion furnace under an oxygen flow at 550° C. for two hours including a twenty two minute ramp into the furnace and a twenty two minute ramp out of the furnace. A 2000 Å thick platinum top electrode was sputtered into place to begin step P818. The top electrode was covered with a conventional spin-on negative photoresist. The wafer including the resist was baked in air on a hot plate at 100° C. for five minutes, after which time the wafer was exposed to ultraviolet radiation under mask to pattern the resist. The resist was developed for 1.5 minutes in an n-butyl acetate rinse under a nitrogen atmosphere. The developed pattern was hard baked on a hot plate at 140° C. for five minutes. The wafer was next subjected to ion mill etching. The resist was stripped by conventional plasma etching.

Step P820 included annealing the top electrode in an oxygen diffusion furnace at 800° C. for two hours including a twenty two minute ramp into the furnace and a twenty two minute ramp out of the furnace. As a result of this process, the final wafer held a plurality of square ferroelectric capacitors 400 each having a 6940 $\mu m^2$ surface area.

EXAMPLE 4
Test Measurements

Figure 1:
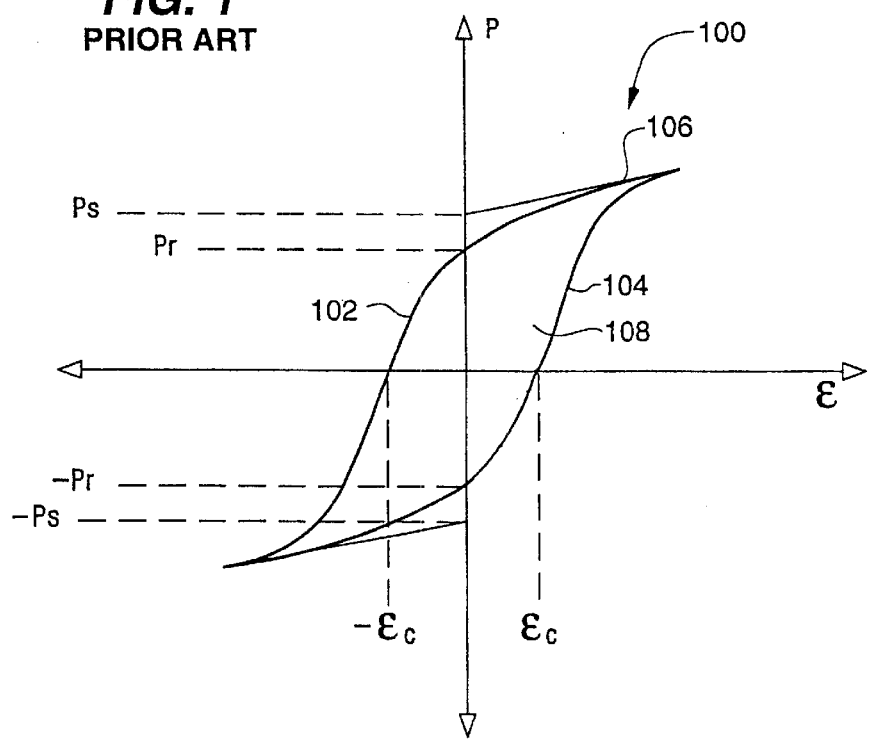
FIG. 1 depicts an idealized conventional ferroelectric polarization hysteresis curve with reference to conventional nomenclature used to describe aspects of the curve.
Figure 2:
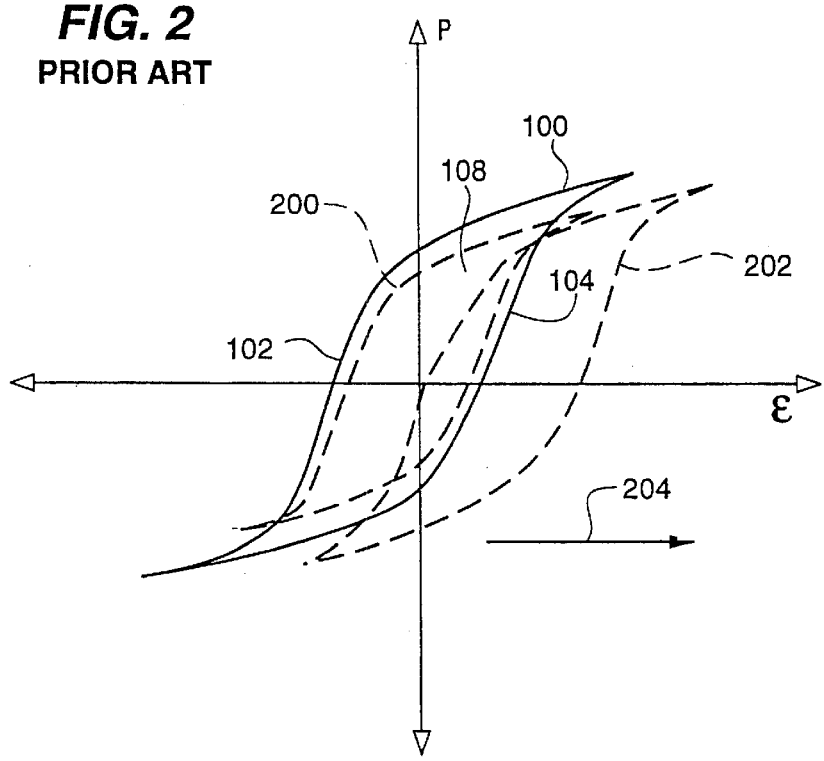
FIG. 2 depicts the idealized FIG. 1 curve adjacent other curves demonstrating polarization fatigue and polarization imprint problems.
Figure 9:
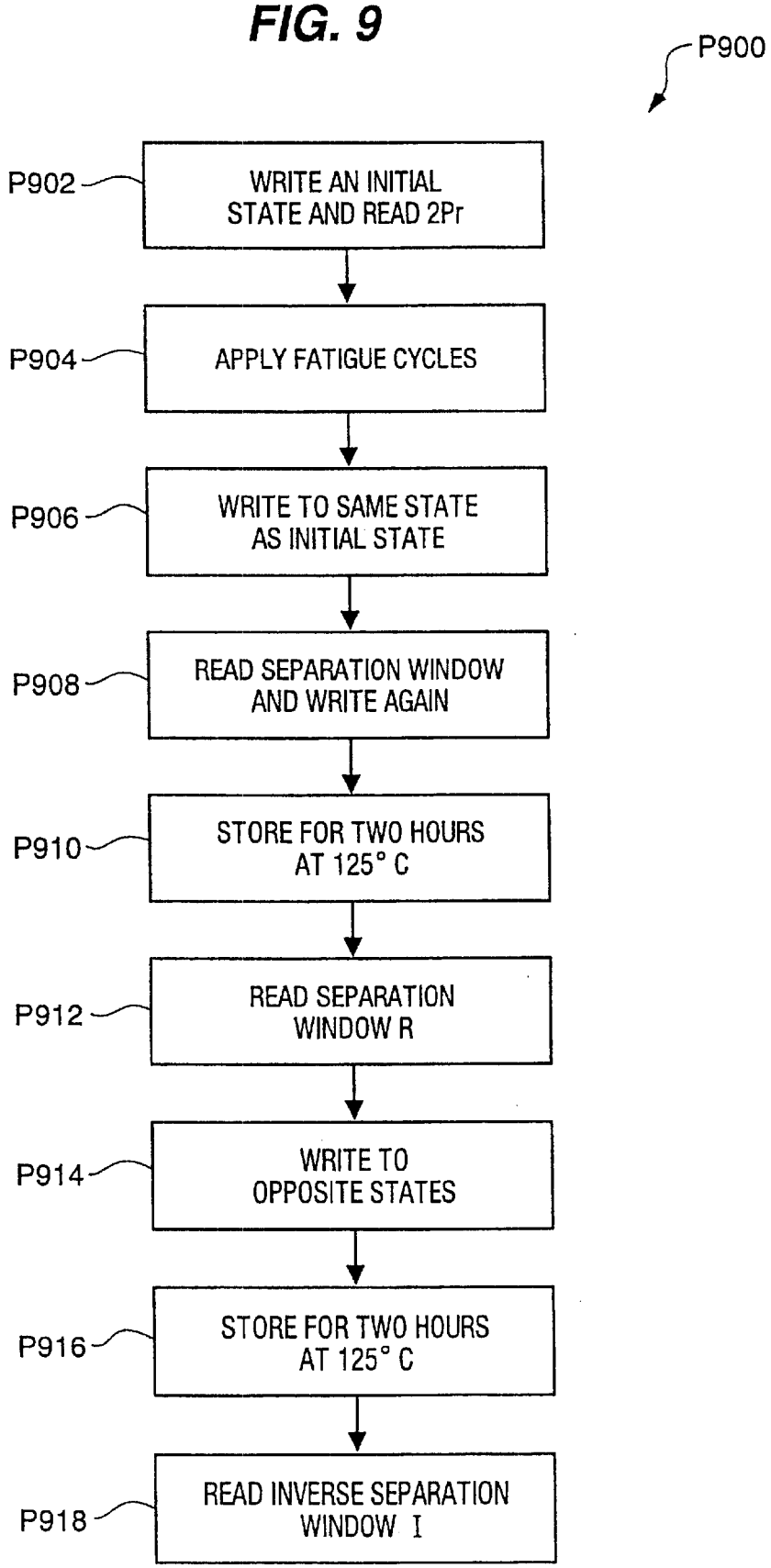
FIG. 9 depicts a process for testing ferroelectric fatigue and imprint together with memory retention over time.

A representative pair of test capacitors was selected from the wafer that was produced in Example 2. A Hewlett Packard 8115A function generator and a Hewlett Packard 54502A digitizing oscilloscope were operably connected to a 9.91 nF load capacitor for conducting switching fatigue endurance measurements on a sample having a constant temperature maintained at 75° C. Probes were used to contact the capacitors, and endurance measurements were commenced according to process P900 as shown in FIG. 9. The virgin ferroelectric capacitors were initially charged with a three volt pulse to orient the domains. Step P902 included fully switching the capacitors to provide a complete hysteresis loop like that shown in FIG. 1. The 2Pr value from this cycle was 21.0 $\mu C/cm^2$. A $\Delta V_{center}$ value was calculated by adding together the coercive voltages ±Vc to arrive at a deviation from, the ideal norm of zero. The −Vc and Vc values were measured as the voltages corresponding to the coercive fields $-E_c$ and $E_c$ for the hysteresis cycle. This $\Delta V_{center}$ value was about −0.12 V.

In step P904, the dual pulse generator was configured to apply $10^{10}$ fatigue cycles as electrical stress to the capacitors using alternating square waves of ±6V magnitude on a 5 MHZ cycle. Switching occurred with the same polarity as for step P902.

Figure 3:
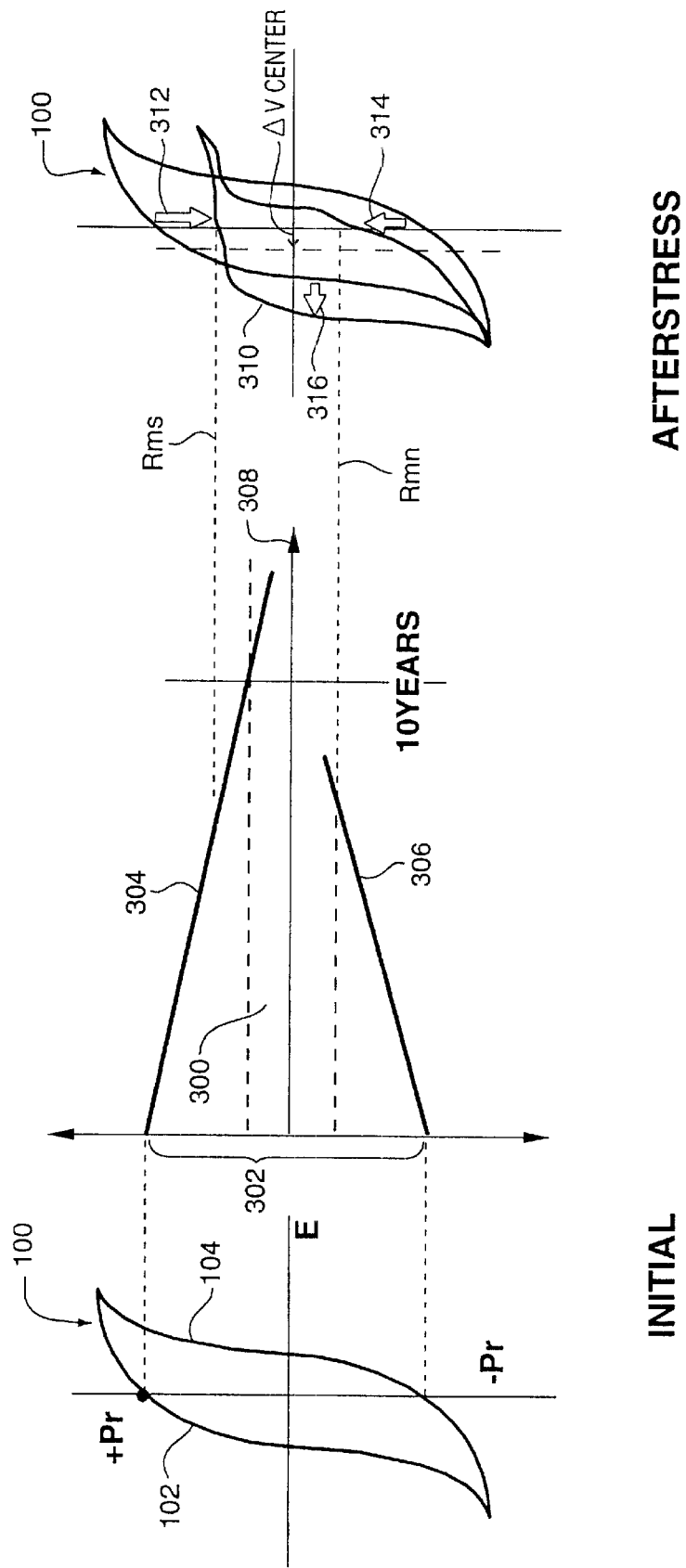
FIG. 3 depicts a schematic representation of the problems that memory control circuitry faces when the ferroelectric materials in ferroelectric memories degrades due to fatigue and imprint problems.

At the conclusion of step P904, a 'write' operation P906 was conducted by writing to the same state as the one first written to in step P902. Step P908 included the reading of the post-fatigue separation window followed by a write operation, which brought the polarization back to the original polarization state. The wafer including the capacitors in this initial state was placed in an oven and stored under thermal stress at 125° C. for two hours. At the end of storage, a read operation P912 was performed to read the separation window R ("RWindow;" 2Pr in the $10^{10}$ imprinted material) from the stored polarization state, and a write operation P914 was performed to the opposite polarization state, i.e., the polarization state other than that first written to in step P902. The RWindow equaled the value after storage of Rms–Rmn, as shown in FIG. 3, and had a value of 4.2 $\mu C/cm^2$.

Step P916 included storing the wafer and the capacitors for another two hours under thermal stress in the oven at 125° C. Finally, the inverse separation window I was read from the stored capacitors. The I window had a value or magnitude approximating that of the RWindow.

EXAMPLE 5
Sensitivity of Imprint Parameters $V_{center}$ and RWindow to Soft Bake Conditions A plurality of wafers were prepared in an identical manner with respect to Example 2, except some departures were made in the soft baking step P812 and the first anneal step P816. Table 3 below summarizes these departures. In the step P812 columns of Table 3, "R" means that the process step was performed by RTP, "F" means that the process step was performed in a diffusion furnace. A thickness shown for each deposition cycle, e.g., P812 1st and P812 2nd, corresponds to the thickness of the soft baked precursor residue at the conclusion of that cycle. Spin-on rpm conditions in step P808 were adjusted to vary the thickness in an attempt to combine a total of about 2000 Å of ferroelectric layered superlattice material in each sample. "2Vc" means the voltage corresponding to the distance between +Ec and −Ec in FIG. 1 for the virgin materials that had not yet been subjected to $10^{10}$ hysteresis cycles. "$V_{BD}$" stands for breakdown voltage, which is expressed as a field value. "2Pr" and "RWindow" refer to the respective polarization windows from −Pr to Pr and Rms to Rmn, respectively, as shown in FIG. 3.

Table 3 for sample 1 shows that the first portion of thin film ferroelectric layered superlattice material layer 420 was deposited in step P812 1st using a spincater at 1300 rpm and dried with the resultant dried residue subjected to, RTP at 725° C. for thirty seconds in oxygen to obtain a 1000 Å thickness in the dried precursor residue. Step P812 2nd used 3500 rpm and RTP at 725° C. for thirty seconds in oxygen to obtain an additional 500 Å thickness. Step P812 3rd used 6000 rpm and RTP at 725° C. to obtain an additional 500 Å thickness. Step P816 included a 650° C. furnace anneal in oxygen to obtain a cumulative thickness of 2080 Å.

TABLE 3

| Sample # | P812 1st | P812 2nd | P812 3rd | P816 | Measurements | |
|---|---|---|---|---|---|---|
| 4 | R725° C./30 sec. O$_2$ 1300 rpm 1000 Å | R725° C./30 sec. O$_2$ 3500 rpm 500 Å | R725° C./30 sec. O$_2$ 6000 rpm 500 Å | F650° C./80 min. O$_2$ | 2 Pr @ 3V: 2 Vc @ 3V: $V_{BD}$ @ 125° C.: RWindow: $\Delta V_{center}$: | 21.0 μC/cm$^2$ 2.34 V 1.10 MV/cm 4.2 μC/cm$^2$ −0.12 V |
| 6 | F800° C./10 min O$_2$ 1300 rpm 1000 Å | F800° C./60 min O$_2$ 3500 rpm 500 Å | F650° C./60 min. O$_2$ 6000 rpm 500 Å | F650° C./60 min. O$_2$ 2010 Å | 2 Pr @ 3V: 2 Vc @ 3V: $V_{BD}$ @ 125° C.: RWindow: $\Delta V_{center}$: | 19.2 μC/cm$^2$ 2.33 V 1.07 MV/cm 3.4 μC/cm$^2$ −0.12 V |
| 7 | R725° C./30 sec O$_2$ 1100 rpm 1000 Å | R725° C./30 sec. O$_2$ 1100 rpm 1000 Å | Not done | F800° C./60 min. O$_2$ 2010 Å | 2 Pr @ 3V: 2 Vc @ 3V: $V_{BD}$ @ 125° C.: RWindow: $\Delta V_{center}$: | 24.4 μC/cm$^2$ 2.16 V 0.99 MV/cm 6.4 μC/cm$^2$ −0.12 V |
| 8 | R650° C./30 sec O$_2$ 1250 rpm 1000 Å | R725° C./30 sec O$_2$ 1100 rpm 1000 Å | Not done | F800° C./80 min O$_2$ 1930 Å | Capacitors shorted | |
| 9 | R725° C./30 sec O$_2$ 1100 rpm 1000 Å | R650° C./30 sec O$_2$ 1250 rpm 1000 Å | Not done | F650° C./60 min O$_2$ 2030 Å | 2 Pr @ 3V: 2 Vc @ 3V: RV$_{BD}$ @ 125° C.: Window: $\Delta V_{center}$: | 21.8 μC/cm$^2$ 2.23 V 1.01 MV/cm 6.0 μC/cm$^2$ −0.105 V |
| 10 | R650° C./30 sec O$_2$ 1250 rpm 1000 Å | R650° C./30 sec O$_2$ 1250 rpm 1000 Å | Not done | F650° C./60 min O$_2$ 1950 Å | 2 Pr @ 3V: 2 Vc @ 3V: $V_{BD}$ @ 125° C.: RWindow: $\Delta V_{center}$: | 21.2 μC/cm$^2$ 2.11 V 1.01 MV/cm 7.4 μC/cm$^2$ −0.10 V |
| 11 | R725° C./30 sec O$_2$ 700 rpm 2000 Å | Not done | Not done | F800° C./60 min O$_2$ 1930 Å | Capacitors shorted | |
| 12 | R650° C./30 sec O$_2$ 800 rpm 2000 Å | Not done | Not done | F650° C./60 min O$_2$ 1890 Å | 2 Pr @ 3V: 2 Vc @ 3V: $V_{BD}$ @ 125° C.: RWindow: $\Delta V_{center}$: | 21.3 μC/cm$^2$ 2.08 V 0.90 MV/cm 4.2 μC/cm$^2$ −0.07 V |
| 13 | F800° C./10 min O$_2$ 1300 rpm 1000 Å | F800° C./60 min O$_2$ 3500 rpm 510 Å | F650° C./60 min. O$_2$ 6000 rpm 500 Å | Not done 2010 Å | 2 Pr @ 3V: 2 Vc @ 3V: $V_{BD}$ @ 125° C.: RWindow: | 18.7 μC/cm$^2$ 2.25 V 1.09 MV/cm 3.0 μC/cm$^2$ |
| 14 | F800° C./10 min O$_2$ 1300 rpm 1000 Å | F800° C./10 min O$_2$ 3500 rpm 520 Å | F800° C./60 min. O$_2$ 6000 rpm 500 Å | Not done 2010 Å | 2 Pr @ 3V: 2 Vc @ 3V: $V_{BD}$ @ 125° C.: RWindow: | 19.5 μC/cm$^2$ 2.25 V 1.04 MV/cm 2.7 μC/cm$^2$ |
| 15 | F650° C./10 min O$_2$ 1300 rpm 1000 Å | F650° C./60 min O$_2$ 3500 rpm 500 Å | F650° C./60 min. O$_2$ 6000 rpm 500 Å | Not done 2010 Å | 2 Pr @ 3V: 2 Vc @ 3V: $V_{BD}$ @ 125° C.: RWindow: | 14.9 μC/cm$^2$ 2.34 V 1.28 MV/cm 3.5 μC/cm$^2$ |
| 16 | R650° C./30 sec O$_2$ 1300 rpm 1000 Å | R650° C./30 sec O$_2$ 3500 rpm 500 Å | R650° C./30 min. O$_2$ 6000 rpm 500 Å | F650° C./60 min. O$_2$ 2120 Å | 2 Pr @ 3V: 2 Vc @ 3V: $V_{BD}$ @ 125° C.: RWindow: | 15.5 μC/cm$^2$ 2.15 V 1.10 MV/cm 4.9 μC/cm$^2$ |
| 17 | R650° C./60 sec O$_2$ 1300 rpm 1000 Å | R650° C./60 sec O$_2$ 3500 rpm 500 Å | R650° C./60 sec O$_2$ 6000 rpm 500 Å | F650° C./60 min O$_2$ 2010 Å | 2 Pr @ 3V: 2 Vc @ 3V: $V_{BD}$ @ 125° C.: RWindow: | 18.8 μC/cm$^2$ 2.24 V 1.16 MV/cm 6.0 μC/cm$^2$ |
| 18 | R650° C./5 min O$_2$ 1300 rpm 1000 Å | R650° C./5 min O$_2$ 3500 rpm 500 Å | R650° C./5 min. O$_2$ 6000 rpm 500 Å | F650° C./60 min. O$_2$ 2110 Å | 2 Pr @ 3V: 2 Vc @ 3V: $V_{BD}$ @ 125° C.: RWindow: | 18.1 μC/cm$^2$ 2.13 V 1.17 MV/cm 4.6 μC/cm$^2$ |

TABLE 3-continued

| Sample # | P812 1st | P812 2nd | P812 3rd | P816 | Measurements | |
|---|---|---|---|---|---|---|
| 21 | R650° C./30 sec $O_2$ 1300 rpm 1000 Å | R650° C./30 sec $O_2$ 3500 rpm 500 Å | R650° C./30 sec. $O_2$ 6000 rpm 500 Å | F650° C./60 min 2 hr $O_2$ 2010 Å | 2 Pr @ 3V: 2 Vc @ 3V: $V_{BD}$ @ 125° C.: RWindow: | 19.2 $\mu C/cm^2$ 2.19 V 0.86 MV/cm 3.8 $\mu C/cm^2$ |
| 22 | R650° C./30 sec $O_2$ 1300 rpm 1000 Å | R650° C./30 sec $O_2$ 3500 rpm 500 Å | R650° C./30 sec. $O_2$ 6000 rpm 500 Å | F650° C./ 5 hr $O_2$ 2010 Å | 2 Pr @ 3V: 2 Vc @ 3V: $V_{BD}$ @ 125° C.: RWindow: | 20.2 $\mu C/cm^2$ 2.17 V 0.83 MV/cm 3.8 $\mu C/cm^2$ |
| 53* | Dry with no RTP 1300 rpm 1000 Å | F350° C./30 min 10% $H_2$ + R650/60 sec $O_2$ 1000 rpm 900 Å | Not done | F650° C./60 min. $O_2$ 1880 Å | 2 Pr @ 3V: 2 Vc @ 3V: $V_{BD}$ @ 125° C.: RWindow: | 14.7 $\mu C/cm^2$ 1.99 V 1.16 MV/cm 7.1 $\mu C/cm^2$ |
| 54* | Dry with no RTP 1300 rpm 1000 Å | F400° C./30 min 10% $H_2$ + R650/60 sec $O_2$ 1000 rpm 900 Å | Not done | F650° C./60 min. $O_2$ 1890 Å | 2 Pr @ 3V: 2 Vc @ 3V: $V_{BD}$ @ 125° C.: RWindow: | 13.7 $\mu C/cm^2$ 2.17 V 1.07 MV/cm 7.1 $\mu C/cm^2$ |
| 55* | No RTP 1300 rpm 1000 Å | F450° C./30 min 10% $H_2$ + R650/60 sec $O_2$ 1000 rpm 1000 Å | Not done | F650° C./60 min. $O_2$ 2010 Å | 2 Pr @ 3V: 2 Vc @ 3V: $V_{BD}$ @ 125° C.: RWindow: | 13.1 $\mu C/cm^2$ 2.38 V 1.03 MV/cm 5.7 $\mu C/cm^2$ |
| 58* | No RTP 1300 rpm 1000 Å | R650° C./60 sec $O_2$ 1000 rpm 1000 Å | Not done | F650° C./60 min. $O_2$ 1870 Å | 2 Pr @ 3V: 2 Vc @ 3V: $V_{BD}$ @ 125° C.: RWindow: | 18.0 $\mu C/cm^2$ 1.99 V 1.00 MV/cm 9.7 $\mu C/cm^2$ |
| 59* | R650° C./60 sec $O_2$ 1300 rpm 1000 Å | R650° C./60 sec $O_2$ 1000 rpm 1000 Å | Not done | F650° C./60 min. $O_2$ 1870 Å | 2 Pr @ 3V: 2 Vc @ 3V: $V_{BD}$ @ 125° C.: RWindow: | 18.0 $\mu C/cm^2$ 1.99 V 1.00 MV/cm 9.7 $\mu C/cm^2$ |
| 60* | R650° C./60 sec $O_2$ 1300 rpm 1000 Å | R650° C./60 sec $O_2$ 1000 rpm 1000 Å | Not done | F650° C./60 min. $O_2$ 1930 Å | 2 Pr @ 3V: 2 Vc @ 3V: $V_{BD}$ @ 125° C.: RWindow: | 20.9 $\mu C/cm^2$ 2.71 V 1.10 MV/cm 12 $\mu C/cm^2$ |
| 61* | R725° C./60 sec $O_2$ 1300 rpm 1000 Å | R725° C./60 sec $O_2$ 1000 rpm 1000 Å | Not done | F800° C./60 min. $O_2$ 1940 Å | 2 Pr @ 3V: 2 Vc @ 3V: $V_{BD}$ @ 125° C.: RWindow: | 22.0 $\mu C/cm^2$ 2.74 V 1.05 MV/cm 10 $\mu C/cm^2$ |

The above results show that the 2Pr values and RWindow separation are generally lower where RTP soft baking is not used and where RTP soft baking is performed at 725° C. Scanning electron microscopy studies show that RTP soft baking of dried precursor residue at 650° C. for thirty seconds to five minutes leaves an essentially smooth surface at the top of ferroelectric layer 420. On the other hand, photomicrographs confirm that RTP at 725° C. did not leave an essentially smooth surface atop the thin film ferroelectric layered superlattice material layer 420. Thus, it is apparent that the improvements in RWindow values which are associated with RTP at 650° C. derive from the flat and smooth electrode structures. Furthermore, lower process RTP and anneal temperatures may produce a lower 2Pr, but also produce a larger RWindow after fatigue.

Sample 7 is one exception to the general rule that 650° C. RTP and 650° C. furnace anneal lead to an improved RWindow. Sample 7 had the second highest RWindow among those measured in samples 4–12, and obtained this from 725° C. RTP and furnace annealing. Subsequent experiments have not repeated these results. The improved RWindow of sample 7 comes at the cost of a few percentage points in $V_{BD}$. Furthermore, sample 7 had the highest initial 2Pr, but also made the most significant percentagewise decline out to the fatigued RWindow after $10^{10}$ switching cycles. Thus, it is somewhat misleading to say that sample 7 represents an optimized process result.

Figure 10:
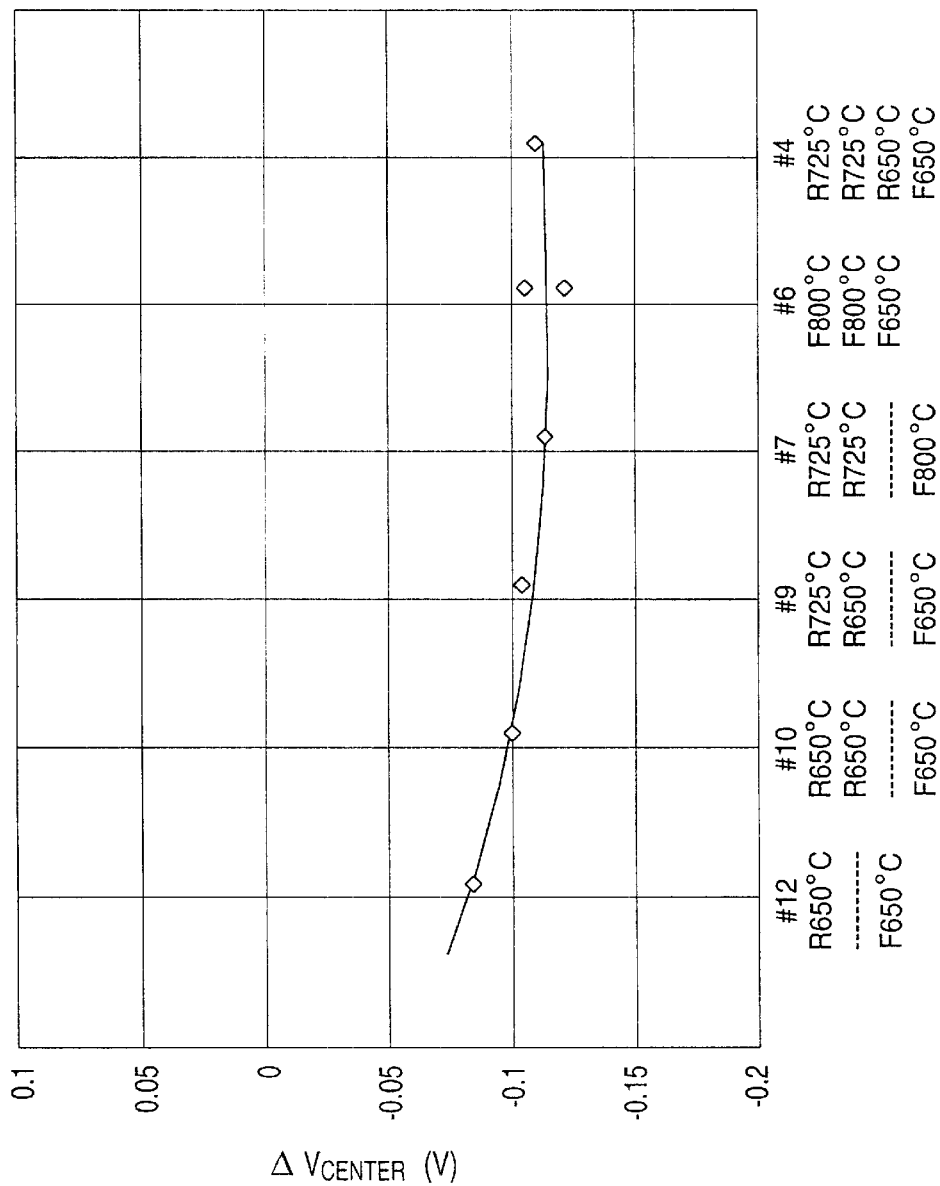
FIG. 10 depicts a comparison of an imprint indicator among several ferroelectric capacitors that were prepared according to different process conditions.

FIG. 10 provides a comparison of samples from Table 3 to show that increasing the thermal budget in the RTP step P812 and the anneal step P816 causes a corresponding increase in the amount of imprint, which is indicated by $\Delta V_{center}$ measured in the initial thin film ferroelectric layered superlattice materials before the application of stress as $10^{10}$ hysteresis cycles.

EXAMPLE 6

Electrical Performance of Ultra Thin Films

The application of 0.12 M precursor liquid to a substrate spinning at about 6000 rpm in step P808 of process P800 provides a thin film ferroelectric layer 420 having a thickness of about 500 Å. All such ferroelectric layered superlattice material films that were produced having thicknesses less than 500 Å shorted out. On the other hand, a film produced in the manner of Example 2 and having a thickness of 647 Å demonstrated a 2Pr of 20.93 $\mu C/cm^2$ and a $\Delta V_{center}$ of −0.01 V. Similarly, a film produced in the manner of Example 3 and having a thickness of 708 Å demonstrated a 2Pr of 21.49 $\mu C/cm^2$. Thus, these ultra-thin ferroelectric layered superlattice material films, which have thicknesses of fifty percent or less than the films shown in Table 3, demonstrate equal or better 2Pr values with lower voltage saturation. These characteristics permit them to be used with significant advantage in new high density FERAM memory cells, e.g., of the type shown in FIG. 7. Additional electronic measurements of the type reported in Table 3 confirm that the ultra thin ferroelectric layered superlattice material films also have equal or better imprint resistance.

Figure 11:
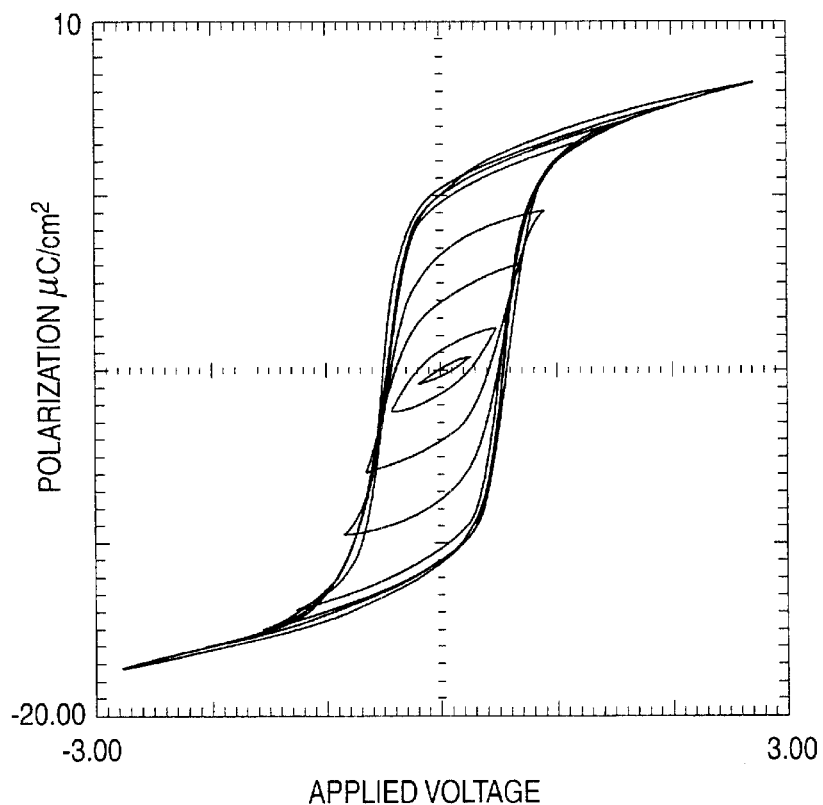
FIG. 11 depicts a polarization hysteresis curve obtained from an ultra thin ferroelectric capacitor that was produced according to the present invention.

FIG. 11 depicts a plurality of hysteresis curve that were obtained at 26° C. from a ferroelectric capacitor having a 707 Å thickness of the $SrBi_{2.6}(Nb_{0.4}Ta_{1.8})O_{10.4}$ layered superlattice material used in Example 3. The curves include those that were obtained by switching the materials at 0.25, 0.5, 0.75, 1, 1.5, 2, 2.5, and 3 V. The 2Pr value at 3 V from was 21.32 $\mu C/cm^2$. The $\Delta V_{center}$ was 0.1.

Figure 12:
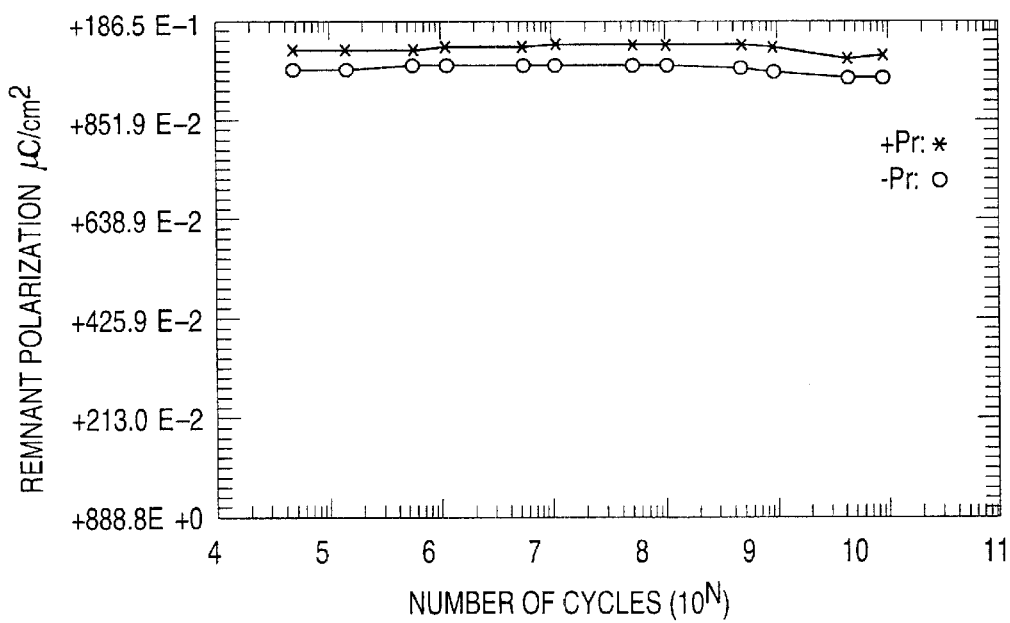
FIG. 12 depicts a polarization fatigue endurance curve that was obtained from the sample used in the hysteresis measurement of FIG. 11.

FIG. 12 depicts the results of a fatigue endurance test that was conducted on the sample of FIG. 11. The sample demonstrated less than about 1.5% of 2Pr degradation after being switched $10^{10}$ cycles using a 1.5 V triangular wave at 10,000 Hz. A similarly robust fatigue endurance was expressed in terms of 2Ec, which also declined less than about 1.5%.

EXAMPLE 7
Electron Microscopy Analysis

Figure 13:
FIG. 13 depicts a scanning electron microscopic photograph of a rough bottom electrode that is undesirable for use in the present invention.

FIG. 13 depicts a scanning electron microscopic photograph of a Pt/Ti stacked bottom electrode structure that was prepared in the manner described in U.S. Pat. No. 5,423,285. That is, the bottom electrodes was sputtered onto a silicon dioxide layer covering a silicon wafer as respective 2000 Å/200 Å thicknesses of Pt/Ti and oxidized at 650° C. for 30 minutes including ten minute ramps into and out of the diffusion furnace. FIG. 13 shows a three micron or 30,000 Å width of the bottom electrode, which has thirty or more substantial hillocks, e.g., hillock 1300, all rising to heights of about 300 Å to 500 Å within nine square microns of one another. This electrode has a very rough surface, as defined by the hillock count.

Figure 14:
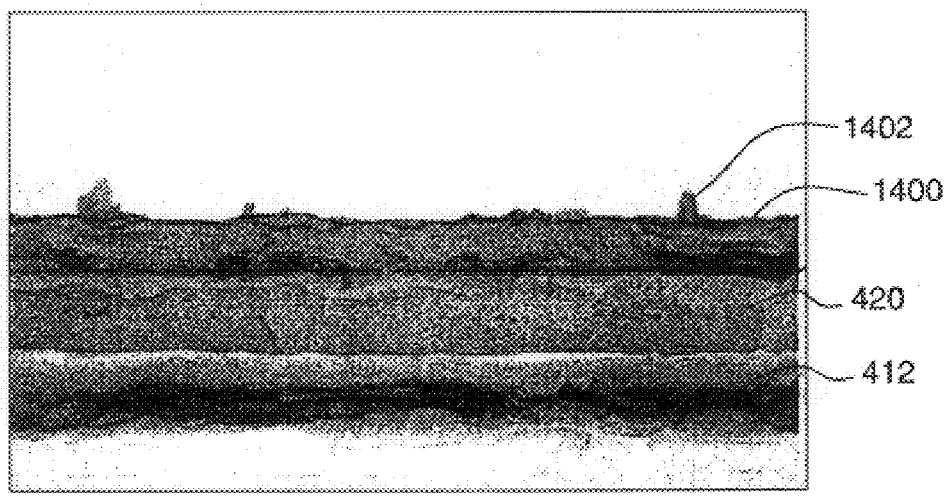
FIG. 14 depicts a transmission electron microscopic photograph of a thin film ferroelectric layered superlattice material on a smooth bottom electrode for use according to the present invention.

A plurality of ferroelectric capacitors were made on a wafer according Example 3. The top platinum electrode was removed using a conventional etching process that did not significantly disturb the ferroelectric material beneath the top electrode. FIG. 14 depicts a transmission electron microscopic photograph of a three micron or 3000 Å wide section of the resultant wafer. FIG. 14 shows an essentially smooth upper surface 1400 of a thin film ferroelectric layered superlattice material 420 on a smooth Pt/TiO₂ bottom electrode 412. Substantially no surface irregularities, such as irregularity 1402, rise more than about 100 Å to 200 Å above surface 1400. Bottom electrode 412 is essentially free of surface irregularities. FIG. 14 shows a smooth bottom electrode and smooth upper surface of ferroelectric layer 420 according to the present invention.

Those skilled in the art will understand that the preferred embodiments described above may be subjected to apparent modifications without departing from the true scope and spirit of the invention. The inventors, accordingly, hereby state their intention to rely upon the Doctrine of Equivalents, in order to protect their full rights in the invention.

What is claimed is:

1. A method of making a ferroelectric capacitor, said method comprising the steps of:

forming an essentially smooth bottom electrode;

depositing a liquid precursor on said bottom electrode to provide a precursor film, said precursor film being capable of yielding a ferroelectric layered superlattice material upon drying and annealing of said precursor film;

drying said precursor film at a temperature less than 400° C. to provide a dried precursor residue;

soft baking said dried precursor residue using RTP at an RTP temperature ranging from 625° C. to 725° C. for a period of time ranging from thirty seconds to five minutes to provide a soft baked precursor residue; and annealing said soft baked precursor residue.

2. The method of claim 1 wherein said step of depositing said liquid precursor includes spinning a wafer while contacting said wafer with said liquid precursor under conditions permitting said drying, soft baking, and annealing steps to produce a solid ferroelectric layered superlattice material corresponding to said precursor film, said solid layered superlattice material having a thickness ranging from 500 Å to 1100 Å.

3. The method of claim 1 wherein said step of depositing said liquid precursor includes spinning a wafer while contacting said wafer with said liquid precursor under conditions permitting said drying, soft baking, and annealing steps to produce a solid ferroelectric layered superlattice material corresponding to said precursor film, said solid layered superlattice material having a thickness ranging from 500 Å to 1000 Å.

4. The method of claim 1 wherein said step of depositing said liquid precursor includes spinning a wafer while contacting said wafer with said liquid precursor under conditions permitting said drying, soft baking, and annealing steps to produce a solid ferroelectric layered superlattice material corresponding to said precursor film, said solid layered superlattice material having a thickness ranging from 500 Å to 800 Å.

5. The method of claim 1 wherein said step of soft baking includes said RTP temperature ranging from 625° C. to 650° C.

6. The method of claim 5 wherein said step of annealing includes said anneal temperature ranging from 520° C. to 560° C.

7. The method of claim 1 wherein said RTP temperature is 650° C. and said anneal temperature is 550° C.

* * * * *